(12) United States Patent
Delacruz et al.

(10) Patent No.: US 10,658,313 B2
(45) Date of Patent: May 19, 2020

(54) SELECTIVE RECESS

(71) Applicant: Invensas Bonding Technologies, Inc., San Jose, CA (US)

(72) Inventors: Javier A. Delacruz, San Jose, CA (US); Rajesh Katkar, Milpitas, CA (US); Shaowu Huang, Sunnyvale, CA (US); Gaius Gillman Fountain, Jr., Youngsville, NC (US); Liang Wang, Newark, CA (US); Laura Wills Mirkarimi, Sunol, CA (US)

(73) Assignee: Invensas Bonding Technologies, Inc., San Jose, CA (US)

( * ) Notice: Subject to any disclaimer, the term of this patent is extended or adjusted under 35 U.S.C. 154(b) by 0 days.

(21) Appl. No.: 16/189,804

(22) Filed: Nov. 13, 2018

(65) Prior Publication Data

US 2019/0181107 A1 Jun. 13, 2019

Related U.S. Application Data

(60) Provisional application No. 62/597,240, filed on Dec. 11, 2017.

(51) Int. Cl.
*H01L 23/00* (2006.01)
*H01L 21/768* (2006.01)
(Continued)

(52) U.S. Cl.
CPC .......... *H01L 24/02* (2013.01); *H01L 21/7684* (2013.01); *H01L 21/7685* (2013.01); *H01L 21/76865* (2013.01); *H01L 23/481* (2013.01); *H01L 24/83* (2013.01); *H01L 25/0657* (2013.01); *H01L 25/50* (2013.01); *H01L 24/05* (2013.01); *H01L 2221/1068* (2013.01); *H01L 2224/056* (2013.01);
(Continued)

(58) Field of Classification Search
CPC .......... H01L 21/76251; H01L 23/5384; H01L 23/481; H01L 21/76898; H01L 21/185
See application file for complete search history.

(56) References Cited

U.S. PATENT DOCUMENTS 5,753,536 A    5/1998  Sugiyama et al.
5,771,555 A    6/1998  Eda et al.
(Continued)

FOREIGN PATENT DOCUMENTS

JP    2013-33786 A     2/2013
JP    2018-160519 A   10/2018
(Continued)

OTHER PUBLICATIONS

International Search Report and Written Opinion, dated Mar. 6, 2019, for PCT Application No. PCT/US2018/061109, 16 pages.
(Continued)

*Primary Examiner* — Changhyun Yi

(57) ABSTRACT

Representative implementations of techniques and devices are used to remedy or mitigate the effects of damaged interconnect pads of bonded substrates. A recess of predetermined size and shape is formed in the surface of a second substrate of the bonded substrates, at a location that is aligned with the damaged interconnect pad on the first substrate. The recess encloses the damage or surface variance of the pad, when the first and second substrates are bonded.

24 Claims, 5 Drawing Sheets

(51) Int. Cl.
*H01L 23/48* (2006.01)
*H01L 25/065* (2006.01)
*H01L 25/00* (2006.01)

(52) U.S. Cl.
CPC .............. *H01L 2224/8303* (2013.01); *H01L 2224/83894* (2013.01); *H01L 2924/10155* (2013.01); *H01L 2924/10253* (2013.01); *H01L 2924/14* (2013.01)

(56) References Cited

U.S. PATENT DOCUMENTS

| | | | |
|---|---|---|---|
| 6,080,640 A | 6/2000 | Gardner et al. | |
| 6,423,640 B1 | 7/2002 | Lee et al. | |
| 6,465,892 B1 | 10/2002 | Suga | |
| 6,887,769 B2 | 5/2005 | Kellar et al. | |
| 6,908,027 B2 | 6/2005 | Tolchinsky et al. | |
| 7,045,453 B2 | 5/2006 | Canaperi et al. | |
| 7,105,980 B2 | 9/2006 | Abbott et al. | |
| 7,193,423 B1 | 3/2007 | Dalton et al. | |
| 7,750,488 B2 | 7/2010 | Patti et al. | |
| 7,803,693 B2 | 9/2010 | Trezza | |
| 8,183,127 B2 | 5/2012 | Patti et al. | |
| 8,349,635 B1 | 1/2013 | Gan et al. | |
| 8,377,798 B2 | 2/2013 | Peng et al. | |
| 8,441,131 B2 | 5/2013 | Ryan | |
| 8,476,165 B2 | 7/2013 | Trickett et al. | |
| 8,482,132 B2 | 7/2013 | Yang et al. | |
| 8,501,537 B2 | 8/2013 | Sadaka et al. | |
| 8,524,533 B2 | 9/2013 | Tong et al. | |
| 8,620,164 B2 | 12/2013 | Heck et al. | |
| 8,647,987 B2 | 2/2014 | Yang et al. | |
| 8,697,493 B2 | 4/2014 | Sadaka | |
| 8,716,105 B2 | 5/2014 | Sadaka et al. | |
| 8,802,538 B1 | 8/2014 | Liu | |
| 8,802,541 B2 | 8/2014 | Wang et al. | |
| 8,809,123 B2 | 8/2014 | Liu et al. | |
| 9,093,456 B2 | 7/2015 | Chapelon | |
| 9,142,517 B2 | 9/2015 | Liu | |
| 9,171,756 B2 | 10/2015 | Enquist et al. | |
| 9,224,704 B2 | 12/2015 | Landru | |
| 9,230,941 B2 | 1/2016 | Chen et al. | |
| 9,257,399 B2 | 2/2016 | Kuang et al. | |
| 9,299,736 B2 | 3/2016 | Chen et al. | |
| 9,312,229 B2 | 4/2016 | Chen et al. | |
| 9,337,235 B2 | 5/2016 | Chen et al. | |
| 9,394,161 B2 | 7/2016 | Cheng et al. | |
| 9,437,572 B2 | 9/2016 | Chen et al. | |
| 9,443,796 B2 | 9/2016 | Chou et al. | |
| 9,461,007 B2 | 10/2016 | Chun et al. | |
| 9,496,239 B1 | 11/2016 | Edelstein et al. | |
| 9,536,848 B2 | 1/2017 | England et al. | |
| 9,559,081 B1 | 1/2017 | Lai et al. | |
| 9,620,481 B2 | 4/2017 | Edelstein et al. | |
| 9,656,852 B2 | 5/2017 | Cheng | |
| 9,723,716 B2 | 8/2017 | Meinhold | |
| 9,728,521 B2 | 8/2017 | Tsai et al. | |
| 9,799,587 B2 | 10/2017 | Fujii et al. | |
| 9,893,004 B2 | 2/2018 | Yazdani | |
| 9,929,050 B2 | 3/2018 | Lin | |
| 9,941,241 B2 | 4/2018 | Edelstein et al. | |
| 9,941,243 B2 | 4/2018 | Kim et al. | |
| 9,960,142 B2 | 5/2018 | Chen et al. | |
| 10,026,605 B2 | 7/2018 | Doub et al. | |
| 9,953,941 B2 | 8/2018 | Enquist | |
| 10,075,657 B2 | 9/2018 | Fahim et al. | |
| 10,269,756 B2 | 4/2019 | Uzoh | |
| 10,276,619 B2 | 4/2019 | Kao et al. | |
| 2004/0084414 A1 | 5/2004 | Sakai et al. | |
| 2006/0057945 A1 | 3/2006 | Hsu et al. | |
| 2007/0111386 A1 | 5/2007 | Kim et al. | |
| 2013/0072011 A1 | 3/2013 | Zhang et al. | |
| 2013/0307165 A1 | 11/2013 | Wang et al. | |
| 2014/0175655 A1 | 6/2014 | Chen et al. | |
| 2015/0048509 A1* | 2/2015 | Nagarajan | B81B 7/0006 257/751 |
| 2015/0054140 A1* | 2/2015 | Chapelon | H01L 23/49811 257/621 |
| 2015/0064498 A1 | 3/2015 | Tong | |
| 2015/0097022 A1 | 4/2015 | DiCioccio et al. | |
| 2016/0343682 A1 | 11/2016 | Kawasaki | |
| 2018/0175012 A1 | 6/2018 | Wu et al. | |
| 2018/0182639 A1 | 6/2018 | Uzoh et al. | |
| 2018/0182666 A1 | 6/2018 | Uzoh et al. | |
| 2018/0219038 A1 | 8/2018 | Gambino et al. | |
| 2018/0323177 A1 | 11/2018 | Yu et al. | |
| 2018/0323227 A1 | 11/2018 | Zhang et al. | |
| 2018/0331066 A1 | 11/2018 | Uzoh et al. | |
| 2019/0115277 A1 | 4/2019 | Yu et al. | |
| 2019/0131277 A1 | 5/2019 | Yang et al. | |

FOREIGN PATENT DOCUMENTS

| | | |
|---|---|---|
| WO | 2005-043584 A2 | 5/2005 |
| WO | 2016083332 A1 | 6/2016 |

OTHER PUBLICATIONS

Ker, Ming-Dou et al., "Fully Process-Compatible Layout Design on Bond Pad to Improve Wire Bond Reliability in CMOS ICs," IEEE Transactions on Components and Packaging Technologies, Jun. 2002, vol. 25, No. 2, pp. 309-316.

Moriceau, H. et al., "Overview of Recent Direct Wafer Bonding Advances and Applications", Advances in Natural Sciences-Nanoscience and Nanotechnology, 2010, 12 pages.

Nakanishi, H. et al., "Studies on SiO2—SiO2 Bonding with Hydrofluoric Acid. Room Temperature and Low Stress Bonding Technique for MEMS," Tech. Research Lab., 200, Elsevier Science S.A., 8 pages.

Oberhammer et al., "Sealing of Adhesive Bonded Devices on Wafer Level," in Sensors and Actuators A, vol. 110, No. 1-3, pp. 407-412, Feb. 29, 2004, see pp. 407-412; and figures 1(a)-1(I), 6 pages.

Plobi et al., "Wafer Direct Bonding: Tailoring Adhesion Between Brittle Materials," Materials Science and Engineering Review Journal, 1999, 88 pages.

* cited by examiner

US 10,658,313 B2

SELECTIVE RECESS

PRIORITY CLAIM AND CROSS-REFERENCE TO RELATED APPLICATION

This application claims the benefit under 35 U.S.C. § 119(e)(1) of U.S. Provisional Application No. 62/597,240, filed Dec. 11, 2017, which is hereby incorporated by reference in its entirety.

FIELD

The following description relates to processing of integrated circuits ("ICs"). More particularly, the following description relates to techniques for processing dies or wafers in preparation for bonding.

BACKGROUND

Dies or wafers, and the like, may be stacked in a three-dimensional arrangement as part of various microelectronic packaging schemes. This can include stacking one or more dies or wafers on a larger base die or wafer, stacking multiple dies or wafers in a vertical arrangement, and various combinations of these. Dies may be stacked on wafers or wafers may be stacked on other wafers prior to singulation. The dies or wafers may be bonded in a stacked arrangement using various bonding techniques, including using direct dielectric bonding, non-adhesive techniques, such as a ZiBond® direct bonding technique or a hybrid bonding technique, such as DBI®, both available from Invensas Bonding Technologies, Inc. (formerly Ziptronix, Inc.), a subsidiary of Xperi Corp. (see for example, U.S. Pat. Nos. 6,864,585 and 7,485,968, which are incorporated herein in their entirety).

When bonding stacked dies or wafers using a direct bonding technique, it is desirable that the surfaces of the dies or wafers to be bonded be extremely flat and smooth. For instance, the surfaces should have a very low variance in surface topology, such that the surfaces can be closely mated to form a lasting bond. It is also desirable that the surfaces be clean and free from impurities, particles, and/or other residue. The presence of undesirable particles for instance, can cause the bond to be defective or unreliable at the location of the particles. For instance, some particles and residues remaining on bonding surfaces can result in voids at the bonding interfaces between the stacked dies.

Respective mating surfaces of the bonded dies or wafers often include embedded conductive interconnect structures, arranged so that the conductive interconnect structures from the respective surfaces are joined during the bonding. The joined interconnect structures form continuous conductive interconnects (for signals, power, etc.) between the stacked dies. Other embedded metallic structures (or pads) may be used for probing/testing/programming a circuit or device of the die during manufacturing and prior to bonding. These probe pads may not have corresponding metallic structures for bonding or may not have further use after bonding.

Generally at least some of the metallic interconnects or pads are probed prior to bonding. In many cases, the softer metallic pads may be deformed by the probe's contact with the pads, displacing some pad material and creating a notable variance in the die's overall surface topology. The variance may be enough to weaken a direct bond or reduce the reliability of the bond at the location of the surface variance. For example, a variance defect may be 0.5 to 1 micron in height, or greater.

It may be desirable to attempt to smooth the variances in the surface topology of the dies (e.g., smooth the displaced pad material or "probe mark") to ensure a more reliable bond. However, in most cases, foundries are less willing to bring dies that have been outside of extreme clean room environments back into those environments for further processing. Also, touch-up chemical-mechanical polishing (CMP) of the damaged die surfaces adds an additional processing step, increasing the manufacturing cost of the dies.

BRIEF DESCRIPTION OF THE DRAWINGS

The detailed description is set forth with reference to the accompanying figures. In the figures, the left-most digit(s) of a reference number identifies the figure in which the reference number first appears. The use of the same reference numbers in different figures indicates similar or identical items.

For this discussion, the devices and systems illustrated in the figures are shown as having a multiplicity of components. Various implementations of devices and/or systems, as described herein, may include fewer components and remain within the scope of the disclosure. Alternately, other implementations of devices and/or systems may include additional components, or various combinations of the described components, and remain within the scope of the disclosure.

DETAILED DESCRIPTION

Overview

Figure 1:
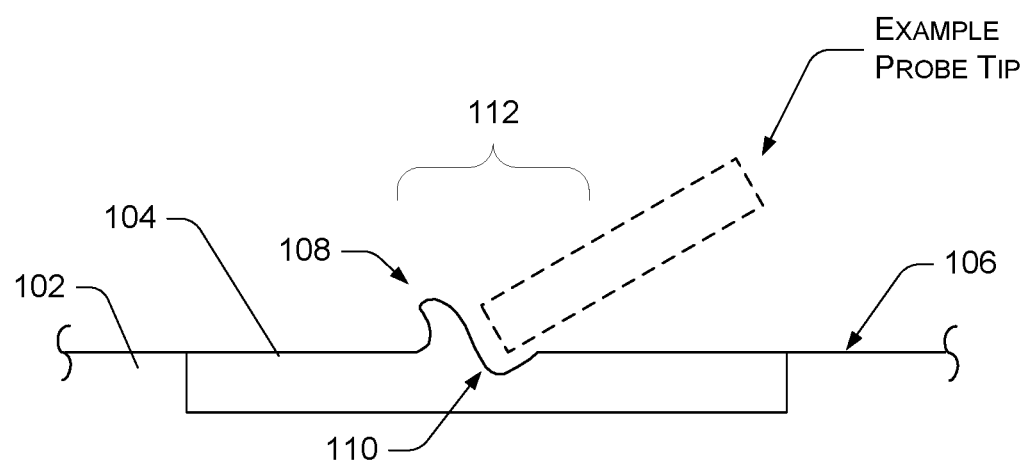
FIG. 1 is a cross-sectional profile view of an interconnect pad embedded within a substrate, showing a displacement of pad material due to probing of the pad.

FIG. 1 is a cross-sectional profile view of a substrate 102 with an embedded interconnect pad 104. The substrate 102 may be comprised of an insulating material or dielectric (e.g., silicon oxide, or the like), for example. In one example, the substrate 102 can represent the top insulating layer of a microelectronic component comprised of a base layer (of active semiconductor, e.g., silicon, or the like) topped with one or more metallization layers within associated insulating layers. In an alternate embodiment, the substrate 102 may be comprised of a conductive material.

Portions of embedded conductive structures, or the like, that are exposed through the surface 106 of the substrate 102 may form an interconnect pad 104. In various embodiments, an interconnect pad 104 may be comprised of only one conductive material or a stack of one or more conductive materials, including aluminum, copper, nickel, titanium, tantalum, gold, etc. In the illustration of FIG. 1, the interconnect pad 104 shows a displacement 108 of pad material due to probing of the pad 104. The displaced material 108 may correspond to a divot 110 in the surface of the pad 104.

The combination of the divot 110 and particularly the displaced pad material 108 creates a variance 112 in the topology of the bonding surface of the substrate 102. Although surface variance 112 is shown to be due to a displacement 108 of pad material on the interconnect pad 104, a surface variance 112 may also be caused by the presence of a contaminant or the like on the surface of the interconnect pad 104. The surface variance 112 may be large enough to weaken a direct bond or to reduce the reliability of a bond at the location of the surface variance 112 when the substrate 102 is directly bonded to another substrate at the surface 106. For instance, the displaced pad material 108 may have a height of 0.1 to 1 micron above the surface 106 of the substrate 102, or greater. For the purposes of the disclosure, a surface variance 112 can comprise any undesirable disruption or variance of the surface topology of the pad 104 and/or the bonding surface 106 of the substrate 102.

Example Embodiments

Figure 2:
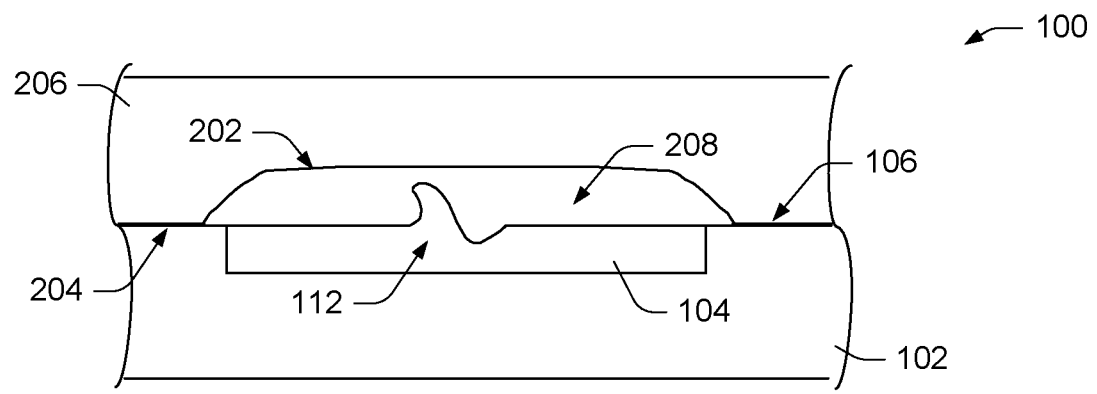
FIG. 2 is a cross-sectional profile view of a bonded structure having a recess in a second substrate aligned with an interconnect pad at a first substrate, the interconnect pad having displaced material, according to an embodiment.
Figure 3:
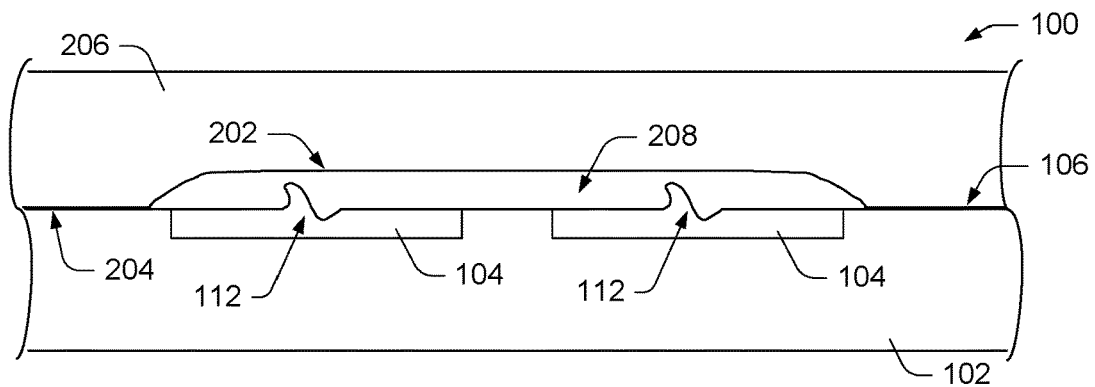
FIG. 3 is a cross-sectional profile view of a bonded structure having a recess in a second substrate aligned with multiple interconnect pads at a first substrate, the interconnect pads having a surface variance, according to an embodiment.
Figure 4:
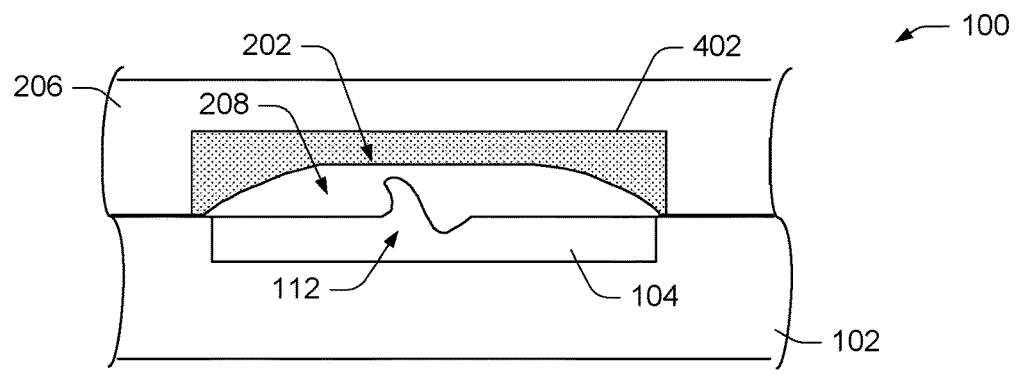
FIG. 4 is a cross-sectional profile view of a bonded structure having a recess aligned with an interconnect pad having displaced material, according to an embodiment.
Figure 5:
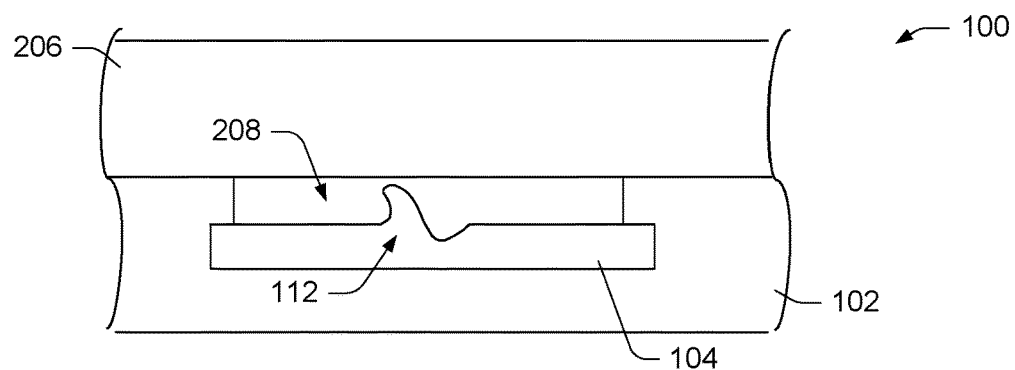
FIG. 5 is a cross-sectional profile view of a bonded structure having an interconnect pad having displaced material embedded within a substrate, according to an embodiment.

Referring to FIGS. 2-5, in various implementations, innovative techniques and devices can be used to remedy or mitigate the effects of damaged pads 104, such as displaced pad material 108, process contaminants, or other surface variances 112 that may be due to probing (i.e., probe marks), processing, and the like. In an example, bonding the substrates 102 and 206 forms a microelectronic assembly 100. For instance, the substrates 102 and 206 may be direct bonded, including using a hybrid bonding technique, without using intervening materials such as adhesives. The surfaces 106 and 204 of the substrates 102 and 206, respectively, are bonded via direct bonding (e.g., via Zibond™), dielectric to dielectric at room temperature without the use of the adhesive. Although one interconnect pad 104 is shown in FIGS. 2, 4, and 5, the substrate 102 may have several interconnect pads 104 (of various shapes and sizes), as shown in FIG. 3.

In an implementation, as shown in FIG. 2, a recess 202 of predetermined size and shape (e.g., area and depth) can be intentionally formed at a selected position in the bonding surface 204 of the second substrate 206 (e.g., carrier, die, wafer, etc.) prior to bonding to the first substrate 102 with the one or more surface variances 112. The recess 202 can be formed at a location on the bonding surface 204 of the second substrate 206 that is to be aligned with a probe mark (or other point of interest) on the first substrate 102 during bonding, to give room for the surface variance 112 and to ensure a reliable bond over the rest of the substrate 102 surface. Although the width of the recess 202 is shown in FIG. 2 to be greater in size than the interconnect pad 104, it also possible that the width of the recess 202 is less than the width of interconnect pad 104. Although displaced pad material 108 or contaminant on top of pad 104 is shown to be centrally located, it could also be positioned off-center, at the edge of the pad 104, and so forth.

In alternate implementations, one or more recesses 202 can be formed on the substrate 206, the substrate 102, or both substrates 102 and 206 as desired. Descriptions within this disclosure that discuss a single recess 202 are also applicable to multiple recesses 202. Also, descriptions within this disclosure that discuss a recess 202 on the substrate 206 and a point of interest (e.g., surface variance 112, etc.) on the substrate 102 are also applicable to a recess 202 on the substrate 102 and a corresponding point of interest (e.g., surface variance 112, etc.) on the substrate 206. Further, a substrate 102 and/or 206 may include one or more recesses 202 on more than one surface of the substrate, as with a bonded stack of more than two substrates, and the like.

In an embodiment, providing the predetermined recess 202 includes recessing the bonding surface 204 of the second substrate 206 (e.g., the insulating material of the second substrate 206) above the interconnect pad 104 (or other point of interest), sufficiently to enclose the probe mark, the process contaminant, or other surface variance 112. In various implementations, as shown in FIG. 3, the predetermined recess 202 may be formed with sufficient size and shape to enclose multiple features or surface variance 112 (e.g., probe marks, contaminants, points of interest, etc.). In an alternate embodiment, the recess 202 may be formed in the surface 204 of the second substrate 206 to perform another function.

In the implementation, the recess 202 in the second substrate 206 forms a cavity 208 when the second substrate 206 is bonded to the first substrate 102. The recess 202 and the resulting cavity 208 can be formed to have a predetermined size and shape (e.g., area, volume, etc.) to enclose the (one or more) surface variance(s) 112 allowing the bonding surface 204 of the second substrate 206 to be flush with the bonding surface 106 of the first substrate 102, despite the surface variance(s) 112 in the topology of the substrate 102. Thus, a reliable direct bond can be formed between the first substrate 102 and the second substrate 206.

In various embodiments, the cavity 208 formed by the recess 202 can be air-filled, gas-filled, filled with some filling materials or encapsulant, or the cavity 208 may be filled with byproducts of the bonding process, and so forth. Alternately, the cavity 208 may enclose a vacuum.

In various implementations, the recess 202 can be created by patterning and etching the surface 204 of the substrate 206 during or after preparing the surface 204 for bonding. For example, in an embodiment, the surface 204 can be prepared for direct bonding by planarizing the surface 204 (using chemical-mechanical planarization (CMP) and/or other techniques) and improving the flatness of the surface 204. A photoresist, for example, can be applied to the prepared surface 204 to pattern the surface 204 for predetermined recess 202 locations. The resist can be exposed and then the surface 204 etched to form the desired recess(es) 202. The substrate 206 can be shipped with the resist intact, or the resist can be removed prior to shipping. In alternate implementations, the recess 202 can be created by CMP, or the like. In other implementations, the recess 202 can be created by laser ablation, electron beam, and so forth.

In various embodiments, the substrate 102 may have several interconnect pads 104 of various shapes and sizes.

As interconnect pads 104 of different sizes are exposed to the surface 106 of the substrate 102 or surface 204 of the substrate 206, and are planarized using a CMP process for instance, they can experience different removal rates, based on their size and material, creating different dishing results. Typically, dishing in larger pads 104 can be greater than dishing in smaller pads during a CMP process.

In various implementations, the predetermined recess(es) 202 and associated cavities 208 can have a depth of tens of nanometers to a few micrometers, or greater as desired. In some implementations, the substrate 102 and/or the substrate 206 can be activated after probing the pad 104 and after recessing the surface 204 of the substrate 206.

Referring to FIG. 4, in one embodiment, providing a predetermined recess 202 and a corresponding cavity 208 includes providing a structure 402 (such as a metallic structure or a structure comprising a same or different material from the substrate 206), with the desired recess 202, and located in the surface 204 of the second substrate 206 at the desired location. For example, the structure 402 may be embedded into the surface 204 of the substrate 206 in a position to be above and aligned with a probe mark or other surface variance 112 on the pad 104 or on the surface 106 of the substrate 102.

In another embodiment, the structure 402 may comprise an embedded interconnect pad, or the like, embedded within the surface 204 of the substrate 206, similar to the interconnect pad 104 at the first substrate 102. The recess 202 in the structure 402 may be due to an excessive dishing to the surface of the structure 402 resulting from a CMP process on the surface 204, or the intentional etching of the structure 402, or a combination of both.

The recess 202 in the structure 402 may be formed or selected to have sufficient dishing to enclose the probe mark or surface variance 112. For example, the recess 202 may be formed to have a predetermined size and shape (e.g., area and depth) to form a cavity 208 with sufficient depth, area, volume, etc. to enclose the variance 112 when the substrate 206 is bonded to the substrate 102. This allows the bonding surface 204 of the second substrate 206 to be flush with the bonding surface 106 of the first substrate 102, despite the surface variance 112 in the topology of the substrate 102. Thus, a reliable direct bond can be formed between the first substrate 102 and the second substrate 206.

Although the top surface of the interconnect pad 104 is shown in FIGS. 1-4 to be substantially flat (except for the surface variance 112) and flushed with the bonding surface 106 of the substrate 102, the top surface of the interconnect pad 104 may also be dished during CMP planarization or other process, and may be below the bonding surface 106 of the substrate 102. In another embodiment, the top surface of the interconnect pad 104 may protrude above the bonding surface 106 of the substrate 104. In the embodiment, a recess 202 formed on the bonding surface 204 of the second substrate 206 can be positioned over the protruding interconnect pad 104 to allow for flush reliable bonding of substrates 102 and 206.

In an alternate embodiment, as shown in FIG. 5, the pad 104 may be formed on a layer beneath the surface 106 of the first substrate 102. In other words, the interconnect pad 104 may be embedded within the substrate 102 such that no part of the pad 104 extends to the surface 106 of the substrate 102. In embodiments, the embedded metallic pad 104 can be uncovered by CMP, etching, etc. for probing or other access. The pad 104 can be formed at a depth below the surface 106 to ensure that after probing or accessing the pad 104, the surface disruption (i.e., material displacement or surface variance 112) of the pad 104 does not extend above the surface 106 of the substrate 102. The substrate 102 can then be bonded successfully to the substrate 206 with the surface 106 flush with the surface 204. In another embodiment, the pad 104 may be formed on a layer beneath the surface 106 of the first substrate 102, and the substrate 206 may still have a recess 202 (not shown) in the surface 204 of the second substrate 206.

As in the previous embodiments described with reference to FIGS. 2-4, the resulting cavity 208 formed by opening the surface 106 of the substrate 102 to access the pad 104 may be air-filled, gas-filled, filled with some filling materials or encapsulant, or the cavity 208 may be filled with byproducts of the bonding process, and so forth. Alternately, the cavity 208 may enclose a vacuum.

Figure 6:
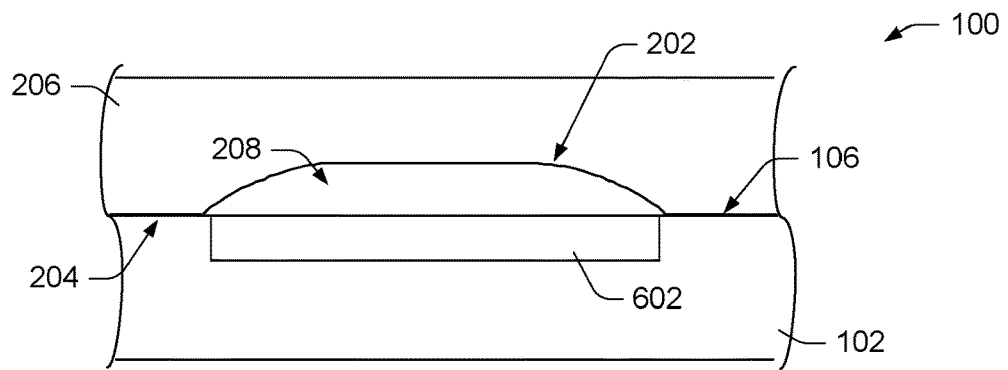
FIG. 6 is a cross-sectional profile view of a bonded structure having a recess aligned with a microcircuit component, according to an embodiment.
Figure 7:
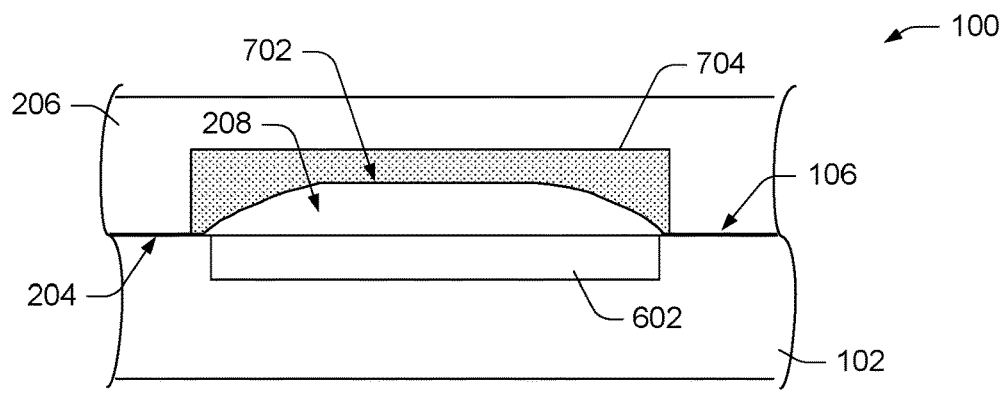
FIG. 7 is a cross-sectional profile view of a bonded structure having a structure having a recess aligned with a microcircuit component, according to an embodiment.

Referring to FIGS. 6 and 7, in an implementation, one or more recesses 202 and/or 702 can be formed in the mating surface 204 of the second substrate 206 that are positioned over a microelectronic component 602 embedded into the substrate 102. The one or more recesses 202 and/or 702 can be in addition to, alternate to, or comprise the recesses 202 discussed above. As shown in FIG. 6, the recess 202 may be formed in the second substrate 206 directly. For instance, the recess 202 may be formed by patterning and etching the surface 204, or like processes. This creates a cavity 208 when the second substrate 206 is bonded to the first substrate 102.

Alternately, as shown in FIG. 7, a recess 702 may be formed in an embedded structure 704 within the substrate 206 (in like manner as described above). The embedded structure 704 may or may not be a conductive pad. In some embodiments, the structure 704 may be a dummy conductive pad, or the like. In some examples, the recess 702 may be formed due to resultant dishing of the structure 704 during CMP planarization of the surface 204, or by etching, etc. Again, a cavity 208 is formed when the second substrate 206 is bonded to the first substrate 102.

In an implementation, the structure 704 has a width that is greater than a width of the microelectronic component 602. In various embodiments, the structure 704 may be shorted (e.g., bonded) to the microelectronic component 602 to make an electrical connection with the microelectronic component 602. For instance, in some embodiments, the structure 704 may be shorted to the microelectronic component 602 to make an electrical connection with other existing or to be determined circuit components. Alternately, the structure 704 may be shorted to the microelectronic component 602 and left floating (e.g., no connection to other circuit elements). Finally, the structure 704 may be floating with respect to the microelectronic component 602, not making a physical or electrical contact with the microelectronic component 602.

Figure 8:
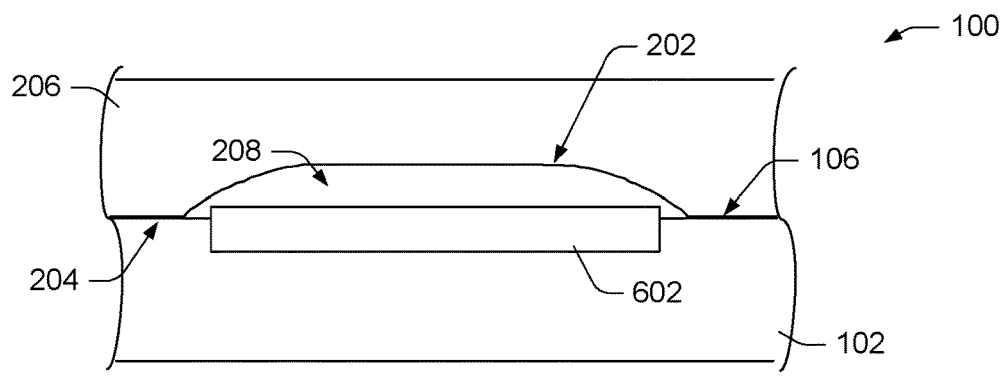
FIG. 8 is a cross-sectional profile view of a bonded structure having a recess aligned with a protruding microcircuit component, according to an embodiment.

In another embodiment, as shown in FIG. 8, a microelectronic component 602 is attached or embedded into the first substrate 102 and at least a portion of the component 602 protrudes above the top surface 106 of the first substrate 102. One or more recesses 202 can be formed in the mating surface 204 of the second substrate 206 that are positioned over the microelectronic component 602, covering the at least the portion protruding above the first surface 106 of the substrate 102, or covering the entire component 602.

In an embodiment, the microelectronic component 602 may comprise one or more microelectronic structures (such as transistors, etc.), circuits, components, or the like, embedded in the surface of the substrate 102. Having the recess 202 positioned over the microelectronic component 602 can potentially reduce mechanical strain or stresses on the microelectronic component 602 caused by bonding the second substrate 206 to the first substrate 102.

In an example embodiment, the microelectronic component 602 may comprise a radio frequency (RF) circuit (or a portion of an RF circuit), or the like. In addition to the structural benefits, the recess 202 and the cavity 208 can provide a lower loss dielectric over the RF circuit 602 as compared to the insulating material of the second substrate 206 (e.g., silicon oxide, etc.). For example, the cavity 208 formed by the recess 202 may be filled with inert gas, air, filler or encapsulant, or another selected material or combination of materials with a desired dielectric characteristic.

Figure 9:
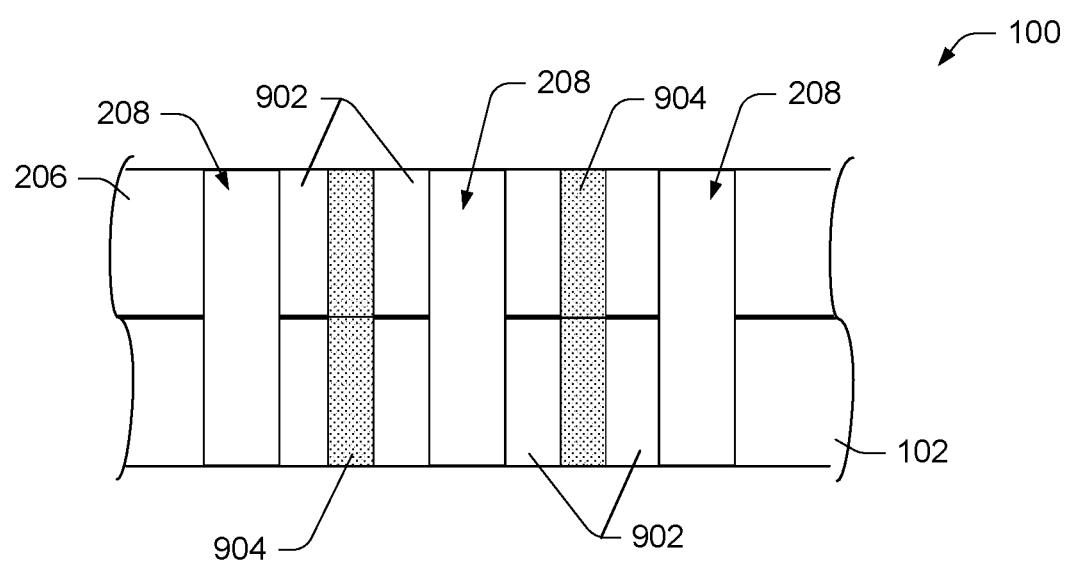
FIG. 9 is a cross-sectional profile view of a bonded structure having one or more interconnect structures and one or more associated voids, according to an embodiment.

In a further implementation, as illustrated in FIG. 9, insulating material 902 between interconnect 904 locations of the first substrate 102 and/or the second substrate 206 can be removed or recessed to reduce capacitive coupling between the interconnects 904. FIG. 9 shows a cross-sectional profile view of two bonded substrates 102 and 206. In the illustrated example, each of the substrates 102 and 206 may have one or more embedded interconnect structures 904 (such as TSVs, metallic layers, interconnect pads, etc.), which may be bonded to form conductive interconnects that extend partially or fully through the substrate 102 and/or the substrate 206.

In the example, some insulating material 902 that is disposed between the interconnect structures 904 can be removed, leaving a void 208, which may extend partially or fully through the substrate 102 and/or the substrate 206. In an embodiment, the void 208 may be filled with a desired material, such as an inert gas, a dielectric filler, or the like, to reduce capacitive coupling between high speed nets connected to the interconnect structures 904. In various embodiments, the size and depth of the recess or void 208 can be selected to create the desired capacitance-reducing effects.

Example Process

Figure 10:
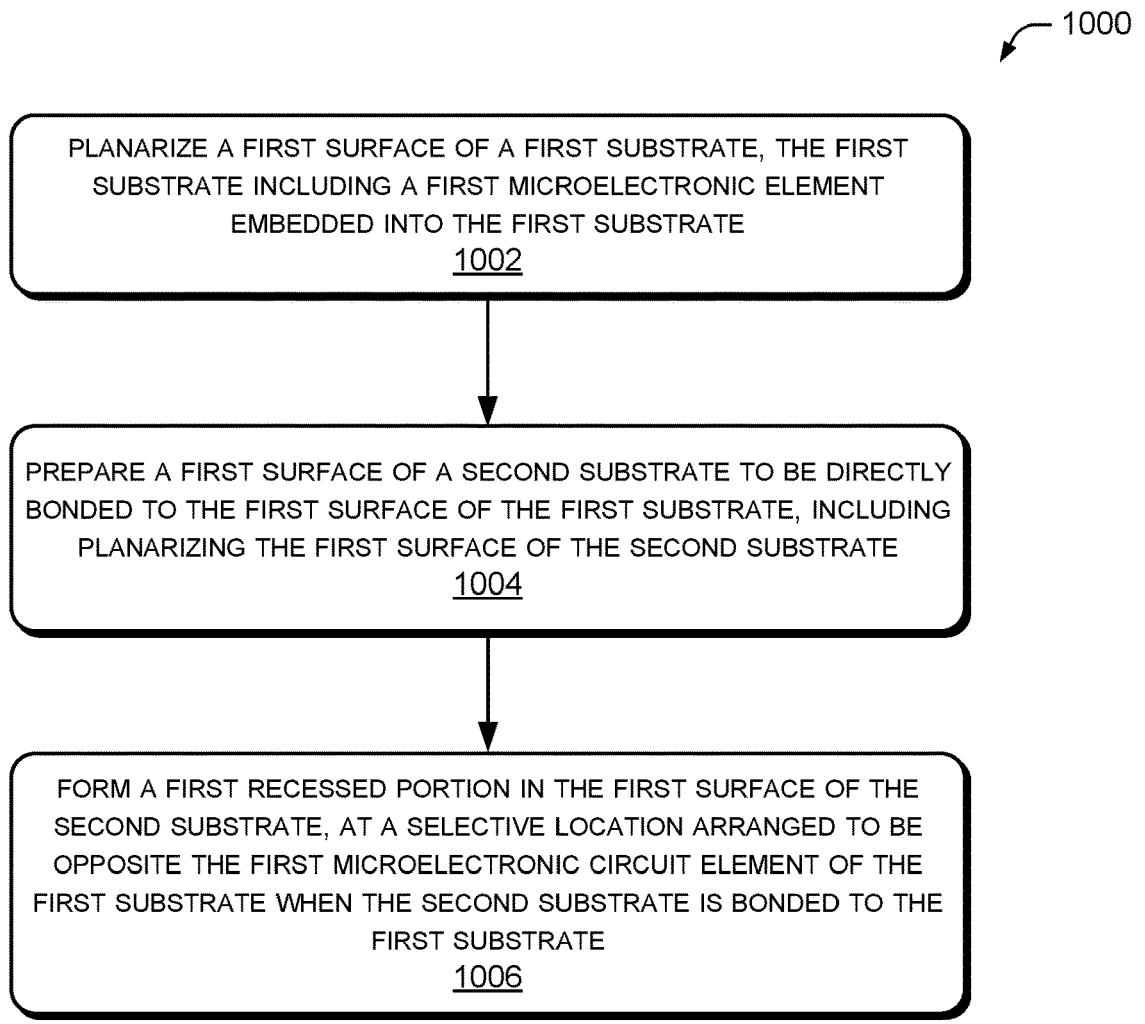
FIG. 10 is a flow diagram illustrating an example process for forming a bonded structure having one or more intentional recesses, according to an embodiment.

FIG. 10 is a flow diagram illustrating an example process 1000 of forming a bonded microelectronic assembly (such as the microelectronic assembly 100) comprising a pair of substrates (such as substrates 102 and 206 for example), wherein at least one of the substrates includes a recess (such as recess 202, for example) positioned over a point of interest (such as a surface variance 112, for example) on the other substrate.

At block 1002, the process includes planarizing a first surface (such as surface 106, for example) of a first substrate (such as substrate 102, for example). In various embodiments, the planarizing may be accomplished using a chemical-mechanical process such as CMP, or the like, and may prepare the surface for direct bonding. In an implementation, the first substrate includes a first microelectronic element (such as microelectronic element 104, for example) embedded into the first substrate. The microelectronic element may include an interconnect pad, a probe pad, a circuit or portion of a circuit, and so forth. An example interconnect pad may comprise a conductive material such as one or more of copper, a copper alloy, aluminum, nickel, gold or like conductive material. One or more conductive materials may also be stacked to form the conductive pad.

At block 1004, the process includes preparing a first surface (such as surface 204, for example) of a second substrate (such as substrate 206, for example) to be directly bonded to the first surface of the first substrate, including planarizing the first surface of the second substrate.

At block 1006, the process includes forming a first recessed portion (such as recess 202, for example) in the first surface of the second substrate, at a selective location arranged to be opposite the first microelectronic element of the first substrate when the second substrate is bonded to the first substrate.

In various implementations, the process includes various techniques to form the recessed portion. For example, in one implementation, the process includes applying a photoresist to the first surface of the second substrate, patterning and exposing a portion of the first surface of the second substrate, where the portion is arranged to be opposite the first microelectronic circuit element of the first substrate when the second substrate is bonded to the first substrate, and etching the portion of the first surface of the second substrate to form the first recessed portion. In alternate implementations, the recessed portion may be formed using laser ablation, electron beam, or other techniques.

In an implementation, the process includes embedding a structure (such as structure 402 or structure 704, for example) in the first surface of the second substrate, and forming the first recessed portion in a surface of the structure facing the first microelectronic element. In such an implementation, the recessed portion may be formed while planarizing the bonding surface of the second substrate. For instance, the structure may comprise a metallic structure (or other material different than the second substrate) and the recessed portion may form in the structure as a result of the CMP process on the bonding surface of the second substrate.

In an implementation, the process includes enclosing a surface topology variance on a surface of the first microelectronic element within the first recessed portion. In another implementation, the process includes enclosing the first microelectronic element or a plurality of microelectronic elements within the first recessed portion. For instance, the first recessed portion can form a cavity (such as cavity 208, for example) with the surface of the first substrate. The cavity may be selected or formed to be sized to enclose the first microelectronic element, a plurality of microelectronic elements, or other features or surface variances of the first substrate as desired.

In an implementation, the process includes bonding the first surface of the second substrate to the first surface of the first substrate via direct bonding without adhesive. In an embodiment, the bonding of the second substrate to the first substrate forms a microelectronic assembly, such as assembly 100, for example. In another embodiment, bonding the second substrate to the first substrate forms the cavity as described above.

In an alternate implementation, the process includes planarizing a first surface of a first substrate, where the first substrate includes a first microelectronic element and a second microelectronic element embedded into the first substrate. In the implementation, the process includes planarizing a first surface of a second substrate, where the second substrate includes a third microelectronic element and a fourth microelectronic element embedded into the second substrate.

In the implementation, the process includes forming a first recessed portion in the first surface of the first substrate, at a selective location between the first and second microelectronic elements; and forming a second recessed portion in the first surface of the second substrate, at a selective location between the third and fourth microelectronic elements. In various embodiments, the process includes forming multiple recessed portions (between microelectronic elements, if desired) in the first and/or second substrates.

One or more of the recessed portions may extend partially or fully through the first and/or second substrates.

In various embodiments, the first, second, third, and fourth microelectronic elements comprise conductive interconnect structures or layers, through silicon vias (TSVs), or the like (such as microelectronic elements 904, for example). For instance, the microelectronic elements may extend partially or fully through the first and/or second substrates. In some embodiments, one or more of the first, second, third, and fourth microelectronic elements comprise circuits, circuit components or elements, or portions of circuits.

In an implementation, the process includes bonding the first surface of the first substrate to the first surface of the second substrate via direct bonding without adhesive. In an implementation, the process also includes aligning and coupling the first microelectronic element to the third microelectronic element and aligning and coupling the second microelectronic element to the fourth microelectronic element. In an embodiment, the first and second recessed portions (and others if present) are also aligned, forming one or more voids. In an implementation, the process includes reducing a capacitive coupling between the first and second microelectronic elements with the first recessed portion and between the third and fourth microelectronic elements with the second recessed portion.

Although various implementations and examples are discussed herein, further implementations and examples may be possible by combining the features and elements of individual implementations and examples.

CONCLUSION

Although the implementations of the disclosure have been described in language specific to structural features and/or methodological acts, it is to be understood that the implementations are not necessarily limited to the specific features or acts described. Rather, the specific features and acts are disclosed as representative forms of implementing example devices and techniques.

Each claim of this document constitutes a separate embodiment, and embodiments that combine different claims and/or different embodiments are within the scope of the disclosure and will be apparent to those of ordinary skill in the art upon reviewing this disclosure.

What is claimed is:

1. A microelectronic assembly, comprising:
a first substrate having a first surface, the first surface of the first substrate having a planarized topography;
a first microelectronic circuit element embedded into the first substrate;
a second substrate having a first surface, the first surface of the second substrate having a planarized topography and bonded to the first surface of the first substrate; and
a first recessed portion disposed in the first surface of the second substrate and extending a preselected depth below the first surface of the second substrate, the first recessed portion selectively located to be opposite the first microelectronic circuit element of the first substrate, wherein the first recessed portion has an area and a depth arranged to fully enclose a portion of the first microelectronic circuit element protruding above the first surface of the first substrate.

2. The microelectronic assembly of claim 1, wherein the first microelectronic circuit element comprises a conductive interconnect or a conductive probe pad.

3. The microelectronic assembly of claim 2, wherein the interconnect or probe pad has a surface topology variance of between 50 and 100 nanometers due to displaced material on a surface of the interconnect or probe pad.

4. The microelectronic assembly of claim 2, wherein the interconnect or probe pad has a surface topology variance of between 100 and 300 nanometers due to displaced material on a surface of the interconnect or probe pad.

5. The microelectronic assembly of claim 2, wherein the interconnect or probe pad has a surface topology variance of at least 300 nanometers due to displaced material on a surface of the interconnect or probe pad.

6. The microelectronic assembly of claim 5, wherein the first recessed portion has an area and a depth arranged to fully enclose the surface topology variance protruding above the first surface of the first substrate.

7. The microelectronic assembly of claim 1, further comprising a structure embedded into the first surface of the second substrate, the first recessed portion disposed in a surface of the structure facing the first surface of the first substrate.

8. The microelectronic assembly of claim 7, wherein the structure comprises a metallic pad and the first recessed portion comprises a concave surface of the metallic pad.

9. The microelectronic assembly of claim 1, further comprising one or more second microelectronic circuit elements embedded into the first substrate, and wherein the first recessed portion is selectively located to be opposite the first microelectronic circuit element and the one or more second microelectronic circuit elements of the first substrate.

10. The microelectronic assembly of claim 1, further comprising:
one or more second microelectronic circuit elements embedded into the first substrate, a width of the first microelectronic element being greater than a width of at least one of the second microelectronic circuit elements; and
one or more third microelectronic circuit elements embedded into the second substrate, wherein at least one of the one or more second microelectronic circuit elements is in physical contact with at least one of the one or more third microelectronic elements, and
wherein the first recessed portion is selectively located to be above the first microelectronic circuit element such that the first microelectronic circuit element is not in physical contact with the first surface of the second substrate while the first surface of the first substrate is direct bonded to the first surface of the second substrate without adhesive.

11. The microelectronic assembly of claim 10, wherein the first recessed portion is formed in the first surface of the first substrate or the first surface of the second substrate.

12. The microelectronic assembly of claim 1, wherein the first microelectronic circuit element is not in physical contact with a surface of the first recessed portion of the first surface of the second substrate.

13. The microelectronic assembly of claim 1, wherein the first recessed portion has a greater width than a width of the first microelectronic circuit element.

14. The microelectronic assembly of claim 1, wherein at least a portion of the first microelectronic circuit element protrudes above the first surface of the first substrate.

15. The microelectronic assembly of claim 1, wherein the first surface of the second substrate is bonded to the first surface of the first substrate via direct bonding without adhesive.

16. A microelectronic assembly, comprising:
a first substrate having a first surface, the first surface of the first substrate having a planarized topography;
a first microelectronic circuit element embedded into the first substrate and disposed at a layer below a layer of the first surface of the first substrate;
a second substrate having a first surface, the first surface of the second substrate having a planarized topography and direct bonded to the first surface of the first substrate without adhesive; and
a first recessed portion disposed in the first surface of the first substrate and exposing the first microelectronic circuit element of the first substrate, the first recessed portion has an area and a depth arranged to fully enclose a surface topology variance protruding above a surface of the first microelectronic circuit element.

17. A method, comprising:
planarizing a first surface of a first substrate, the first substrate including a first microelectronic element embedded into the first substrate;
preparing a first surface of a second substrate to be directly bonded to the first surface of the first substrate, including planarizing the first surface of the second substrate;
forming a first recessed portion in the first surface of the second substrate, at a selective location arranged to be opposite the first microelectronic element of the first substrate when the second substrate is bonded to the first substrate; and
enclosing a portion of the first microelectronic element that protrudes above the first surface of the first substrate, within the first recessed portion.

18. The method of claim 17, further comprising bonding the first surface of the second substrate to the first surface of the first substrate via direct bonding without adhesive.

19. The method of claim 17, further comprising:
applying a photoresist to the first surface of the second substrate;
patterning and exposing a portion of the first surface of the second substrate, the portion arranged to be opposite the first microelectronic circuit element of the first substrate when the second substrate is bonded to the first substrate; and
etching the portion of the first surface of the second substrate to form the first recessed portion.

20. The method of claim 17, further comprising removing a portion of the first surface of the second substrate using laser ablation or an electron beam to form the recessed portion.

21. The method of claim 17, further comprising embedding a structure in the first surface of the second substrate, and forming the first recessed portion in a surface of the structure facing the first microelectronic element.

22. The method of claim 21, wherein the structure comprises a metallic pad.

23. The method of claim 17, further comprising enclosing a surface topology variance on a surface of the first microelectronic element within the first recessed portion.

24. A microelectronic assembly, comprising:
a first substrate having a first surface, the first surface of the first substrate having a planarized topography;
a first microelectronic circuit element embedded into the first substrate, at least a portion of the first microelectronic circuit element protruding above the first surface of the first substrate;
a second substrate having a first surface, the first surface of the second substrate having a planarized topography that is bonded to the first surface of the first substrate; and
a first recessed portion disposed in the first surface of the second substrate and extending a preselected depth below the first surface of the second substrate, the first recessed portion selectively located to be opposite the first microelectronic circuit element of the first substrate.

* * * * *